United States Patent
Ohashi

(10) Patent No.: US 6,405,336 B1
(45) Date of Patent: Jun. 11, 2002

(54) DEVICE AND METHOD FOR TESTING A SEMICONDUCTOR

(75) Inventor: Akira Ohashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/293,682

(22) Filed: Apr. 16, 1999

(30) Foreign Application Priority Data

Apr. 16, 1998 (JP) ............................................. 10-106069

(51) Int. Cl.$^7$ ................................................. G06F 11/00
(52) U.S. Cl. ........................................ 714/738; 714/744
(58) Field of Search ................................. 714/736, 700, 714/731, 738, 741, 744; 324/158.1; 326/16

(56) References Cited

U.S. PATENT DOCUMENTS

| | | | | |
|---|---|---|---|---|
| 4,497,056 A | * | 1/1985 | Sugamori | 714/736 |
| 5,225,775 A | * | 7/1993 | Sekino | 324/158.1 |
| 5,436,908 A | * | 7/1995 | Fluker et al. | 714/700 |
| 5,578,938 A | * | 11/1996 | Kazami | 326/16 |
| 5,809,034 A | * | 9/1998 | Rezvani et al. | 714/700 |
| 5,974,575 A | * | 10/1999 | Fujimoto | 714/700 |
| 6,070,260 A | * | 5/2000 | Buch et al. | 714/731 |

FOREIGN PATENT DOCUMENTS

| | | |
|---|---|---|
| JP | 09054136 A | 2/1997 |
| JP | 09153073 A | 6/1997 |

* cited by examiner

Primary Examiner—David Ton
(74) Attorney, Agent, or Firm—Scully, Scott, Murphy & Presser

(57) ABSTRACT

A method for generating a test pattern used for testing, by an LSI tester, a semiconductor integrated circuit having external terminals and sequential unitary circuits, comprising the steps of: extracting, from circuit connection information of the semiconductor, at least one sequential unitary circuit having a pair of potentially contending input terminal, and a pair of potentially contending external terminals connected to the input terminals; and further extracting therefrom a pair of actually contending external terminals connected to the same sequential unitary circuit and concurrently changing their signal level in a test pattern. On the basis of a path delay value from each of the actually contending external terminals to the corresponding sequential unitary circuit, and on the basis of the value of a tester skew, determining an optimum timing condition in the sequential unitary circuit; and generating the test pattern for the LSI tester on the basis of the optimum timing condition.

12 Claims, 9 Drawing Sheets

Fig. 3 PRIOR ART
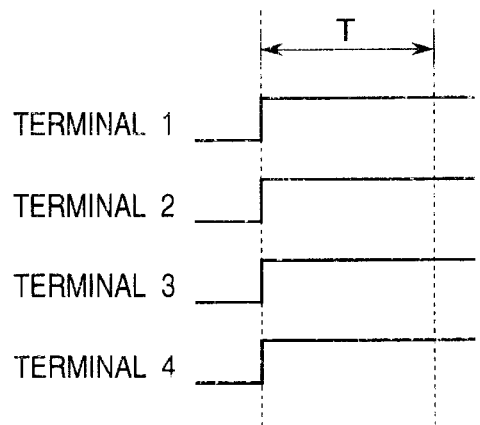
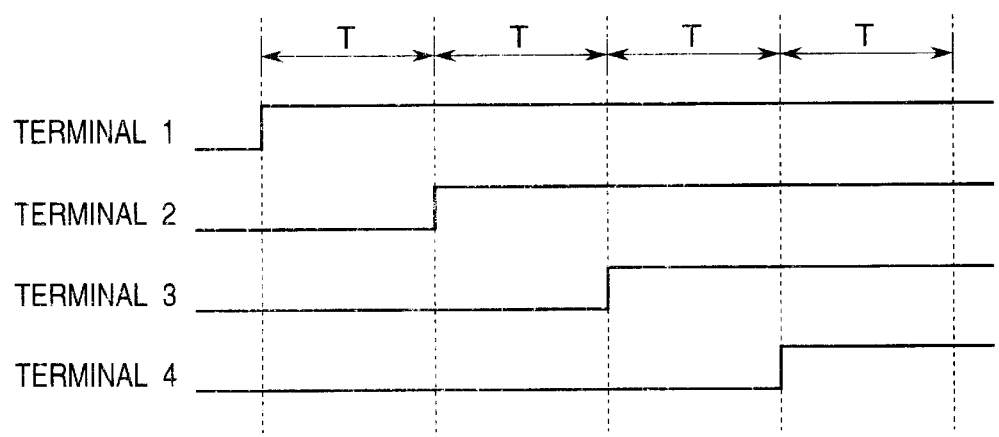
T : PATTERN PERIOD

Fig. 4 PRIOR ART
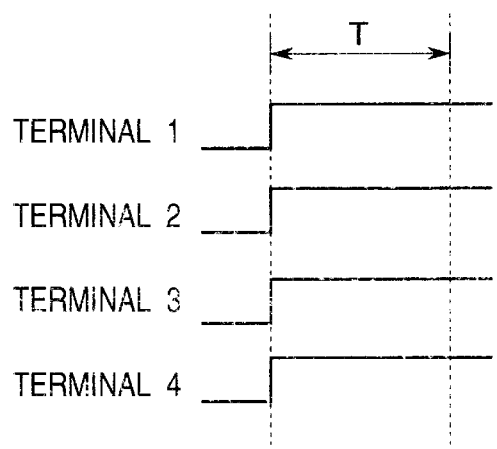
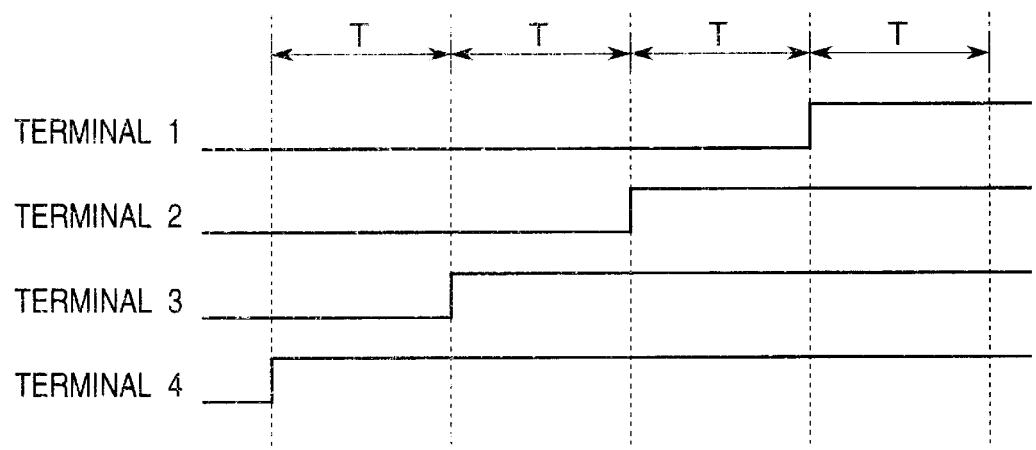
T: PATTERN PERIOD

DEVICE AND METHOD FOR TESTING A SEMICONDUCTOR

BACKGROUND OF THE INVENTION

1. Field of the Invention

The present invention relates to a method and a system for generating a test pattern of an LSI tester, and more specifically to a method and a system for generating an LSI tester pattern used when a final test of a semiconductor integrated circuit is executed by an LSI tester.

2. Description of Related Art

In a fabricating process of the semiconductor integrated circuit, first, a logic circuit is designed in accordance with a required specification of a product, a test pattern is prepared for the logic circuit, and a logic simulation is executed using the test pattern prepared, in order to verify the function and the operation timing of the logic circuit.

Furthermore, before an actually fabricated semiconductor integrated circuit is shipped as a product, a final test of the actually fabricated semiconductor integrated circuit is executed by use of an LSI tester by using the same pattern as the test pattern used in the simulation. In the LSI tester, an output signal outputted from the semiconductor integrated circuit is compared with an expected output value verified in the simulation when the same test pattern is applied. Thus, it is verified that the semiconductor integrated circuit has the same function as that of the designed logic circuit and operates at the same timing as that of the designed logic circuit.

However, there are cases in which when the final test was performed by the LSI tester, the output signal of a non-defective semiconductor integrated circuit is not consistent with the expected output value corresponding to the test pattern, with the result that the non-defective semiconductor integrated circuit is deemed as being a defective. One of causes for this problem is considered to be a tester skew which is a timing difference between signals supplied from pins of the LSI tester to input terminals of the semiconductor integrated circuit.

The LSI tester operates to supply a test pattern to the semiconductor integrated circuit at a designated output timing, namely, at the same timing as that in the simulation. Actually, however, because of an insufficient precision of the LSI tester and a delay of a signal on a tester board, the timing of signals supplied from the LSI tester to the semiconductor integrated circuit, has a skew on the order of several 100 picoseconds to several nanoseconds. Therefore, even if it is intended to supply signals to input terminals of the semiconductor integrated circuit at the same timing, these signals are not necessarily simultaneously inputted to the semiconductor integrated circuit, so that a variation of the input timing occurs within the range of the skew width.

Now, this problem will be further described with reference to FIG. 1, which is a logic diagram illustrating a part of a logic circuit in the semiconductor integrated circuit. The shown partial logic circuit includes external terminals 1, 2 and 3, combinational circuits 5A, 5B, 5C and 5D and flipflops (F/F) 6A and 6B which are sequential unitary circuits. A data signal is supplied from the external terminal 1 through the combinational circuit 5A to a data input D of a second stage flipflop 6B. Another data signal is supplied from the external terminal 2 through the combinational circuit 5B to a data input D of a first stage flipflop 6A. A clock signal is supplied from the external terminal 3 through the combinational circuit 5C to a clock input C of the first stage flipflop 6A.

A data signal is supplied from a data output Q of the first stage flipflop 6A through the combinational circuit 5D to a clock input C of the second stage flipflop 6B.

In order for the flipflop to normally operate, the data signal must become definite a setup time or more before the changing timing of the clock signal, and must be held for a time which starts from the changing timing of the clock signal and which is not shorter than a hold time. If the clock signal and the data signal fulfills this relation, the operation of the flipflop is stable. However, if this relation is not fulfilled, the output of the flipflop is not settled either at a high level or a low level. This condition is called that the clock signal and the data signal "contend" with each other. Therefore, the input timing of the clock signal and the input timing of the data signal must be made to fulfill the above mentioned relation.

In the simulation, if the above relation is fulfilled, an expected value error does not occur in an external output of the semiconductor integrated circuit. However, when the semiconductor integrated circuit is actually tested by the LSI tester, it is in some cases that the above relation is not fulfilled because of the tester skew so that the output of the flipflop does not become definite, and it is in an extreme case that the value should be rightfully latched after the data signal has changed but the value is actually latched before the data signal changes, or alternatively, the value should be rightfully latched before the data signal changes but the value is actually latched after the data signal has changed, with the result that the output value of the flipflop is inverted. If this condition is propagated to the external of the LSI, the non-defective product is discriminated as being defective.

In order to avoid this problem in the prior art, a timing-shifted pattern is prepared by shifting the timing of the pattern change on the input terminals on the basis of the test pattern used in the LSI tester while considering the tester skew, and a logic simulation is executed by using the timing-shifted pattern thus prepared, so as to verify possibility that a trouble in measurement occurs due to the tester skew.

Now, his prior art method will be described with reference to FIG. 2, which is a flow chart illustrating the steps of the prior art method for discriminating the test pattern in order to avoid the trouble in measurement due to the tester skew.

First, a plurality of external terminals concurrently changing the input test patterns (namely, their signal levels) are retrieved from the test pattern for the logic simulation (step S51). The changing timing of the input test patterns (namely, their signal levels) on the external terminals retrieved is shifted from each other, so that a pair of simulation patterns are generated (step S52).

Here, referring to FIGS. 3 and 4, an upper half of these figures shows that the input test patterns (namely, signal levels) on external terminals 1 to 4 concurrently change, and a lower half of these figures shows that, by using the input test pattern on the external terminal 1 as a reference, the changing timing of the input test patterns on the external terminals 2 to 4 are shifted in order by a pattern period T. Specifically, the example of FIG. 3 shows that the changing timing of the input test patterns on the external terminals 2 to 4 are delayed in order from the changing timing of the input test pattern on the external terminal 1. On the other hand, the example of FIG. 4 shows that the changing timing of the input test patterns on the external terminals 2 to 4 are advanced in order from the changing timing of the input test pattern on the external terminal 1.

By using each of the two simulation test patterns 1 and 2 thus prepared, a delayed simulation is executed (step S53 and step S54), and the result of each simulation is examined to check whether or not an error exists in an expected value of output terminals, for the purpose of verifying the skew between the input terminals (step S55). If no error is fount out in each of the two simulations (OK), it is discriminated that there is no possibility that a trouble occurs due to the tester skew, and therefore, the original test pattern can be used in the LSI tester with no modification.

If the expected value error occurs, since there is possibility that a trouble occurs due to the tester skew, it is necessary to modify the test pattern. In this case, however, it is not possible to easily specify which of inter-terminal skews causes the expected value error. Therefore, a massive analysis has to be executed.

The reason for this is that: The prior art method is only to shift the timing of the test patterns in the same way, to execute the simulations and to discriminate OK/NG on the basis of the result of the simulations, but does not have a function of specifying the cause. Therefore, it was not possible to obtain an optimum input timing of the test pattern which has overcome the problem of the inter-terminal skew of the tester.

A prior art for overcoming the prior art problem mentioned above, is disclosed by Japanese Patent Application Pre-examination Publication No. JP-A-09-153073 (an English abstract of which is available and the content of the English abstract is incorporated by reference in its entirety into this application).

Applying this prior art method to two cascaded flipflop stages as shown in FIG. 1, it is recognized that only the first stage flipflop is influenced by the tester skew, and for only the first stage flipflop, the path delay is calculated, and the influence of the tester skew is discriminated.

However, what is influenced by the tester skew is not limited to only the first stage flipflop, and all flipflops causing the contending are influenced by the tester skew. The reason for this will be described with reference to the logic circuit shown in FIG. 1.

When the input test patterns (namely, signal levels) supplied to the external terminal 2 and the external terminals 3 respectively do not change concurrently, no contending occurs in the first stage flipflop 6A. However, if the input test patterns (namely, signal levels) supplied to the external terminal 2 and the external terminals 3 respectively change concurrently, there is possibility that the contending occurs in the second stage flipflop 6B. Therefore, the second stage flipflop 6B is influenced by the tester skew.

SUMMARY OF THE INVENTION

Accordingly, it is an object of the present invention to provide a method and a system for generating a test pattern of an LSI tester, which have overcome the above mentioned problem of the prior art.

Another object of the present invention is to provide a method and a system for generating an LSI tester test pattern having a timing relation which causes no contending.

Still another object of the present invention is to provide a method and a system for generating an LSI tester test pattern having a timing relation which causes no contending, by detecting a combination of a sequential unitary circuit such as a flipflop having possibility that a circuit operation changes due to an inter-terminal skew of an LSI tester in view of a circuit construction, with a pair of external input terminals connected to a data input and a clock input of the sequential unitary circuit, by performing a static timing verification for the pair of contending external input terminals so as to obtain a timing relation causing no contending, and by reflecting the thus obtained timing relation to a test program.

A further object of the present invention is to provide a recording medium recording a program for executing the method in accordance with the present invention.

The above and other objects of the present invention are achieved in accordance with the present invention by a method for generating a test pattern used for testing, by an LSI tester, a semiconductor integrated circuit having a plurality of external terminals and a plurality of sequential unitary circuits, comprising the steps of:

extracting, from circuit connection information of the semiconductor integrated circuit, at least one first level combination composed of a sequential unitary circuit having a first input and a second input having possibility of causing the contending in a circuit construction, and a pair of potentially contending external terminals connected to the first input and the second input of the sequential unitary circuit;

extracting, from the at least one first level combination thus extracted, at least one second level combination composed of a pair of actually contending external terminals connected to the same sequential unitary circuit and concurrently changing their signal level in a test pattern, and a corresponding sequential unitary circuit;

in each of the at least one second level combination thus extracted, on the basis of a path delay value from each of the actually contending external terminals to the corresponding sequential unitary circuit, and on the basis of the value of a tester skew, determining an optimum timing condition preventing the contending in the sequential unitary circuit; and generating the test pattern for the LSI tester on the basis of the optimum timing condition thus determined.

According to another aspect of the present invention, there is provided a system for generating a test pattern used for testing, by an LSI tester, a semiconductor integrated circuit having a plurality of external terminals and a plurality of sequential unitary circuits, comprising:

a means for extracting, from circuit connection information of the semiconductor integrated circuit, at least one first level combination composed of a sequential unitary circuit having a first input and a second input having possibility of causing the contending in a circuit construction, and a pair of potentially contending external terminals connected to the first input and the second input of the sequential unitary circuit;

a means for extracting, from the at least one first level combination thus extracted, at least one second level combination composed of a pair of actually contending external terminals connected to the same sequential unitary circuit and concurrently changing their signal level in a test pattern, and a corresponding sequential unitary circuit;

a means for determining an optimum timing condition preventing the contending in the sequential unitary circuit, in each of the at least one second level combination thus extracted, on the basis of a path delay value from each of the actually contending external terminals to the corresponding sequential unitary circuit, and on the basis of the value of a tester skew; and a means for generating the test pattern for the LSI tester on the basis of the optimum timing condition thus determined.

According to still another aspect of the present invention, there is provided a recording medium recording a program for generating a test pattern used for testing, by an LSI tester, a semiconductor integrated circuit having a plurality of external terminals and a plurality of sequential unitary circuits, the program comprising the steps of:

extracting, from circuit connection information of the semiconductor integrated circuit, at least one first level combination composed of a sequential unitary circuit having a first input and a second input having possibility of causing the contending in a circuit construction, and a pair of potentially contending external terminals connected to the first input and the second input of the sequential unitary circuit;

extracting, from the at least one first level combination thus extracted, at least one second level combination composed of a pair of actually contending external terminals connected to the same sequential unitary circuit and concurrently changing their signal level in a test pattern, and a corresponding sequential unitary circuit;

in each of the at least one second level combination thus extracted, calculating the path delay value from each of the actually contending external terminals to the corresponding sequential unitary circuit, and obtaining a tester skew margin from the path delay values and a setup time and a hold time of the sequential unitary circuit;

comparing the tester skew margin with the value of a tester skew, to discriminate whether or not at least one of a setup error and a hold error occurs in the sequential unitary circuit when respective input timing of signals to the pair of actually contending external terminals connected to the first input and the second input of the sequential unitary circuit, respectively, are deviated from each other by the value of the tester skew;

when the at least one of a setup error and a hold error occurs, determining an optimum timing condition preventing the contending in the sequential unitary circuit; and executing a simulation by using the test pattern having the input timing shifted on the basis of the optimum timing condition thus determined, and if the result of the simulation is good, determining the test pattern having the input timing shifted, as the test pattern for the LSI tester.

The above and other objects, features and advantages of the present invention will be apparent from the following description of preferred embodiments of the invention with reference to the accompanying drawings.

BRIEF DESCRIPTION OF THE DRAWINGS

FIGS. 3 and 4 illustrate how the changing timing of the input test patterns on the external terminals are shifted from one another in the prior art method;

DESCRIPTION OF THE PREFERRED EMBODIMENTS

Figure 1:
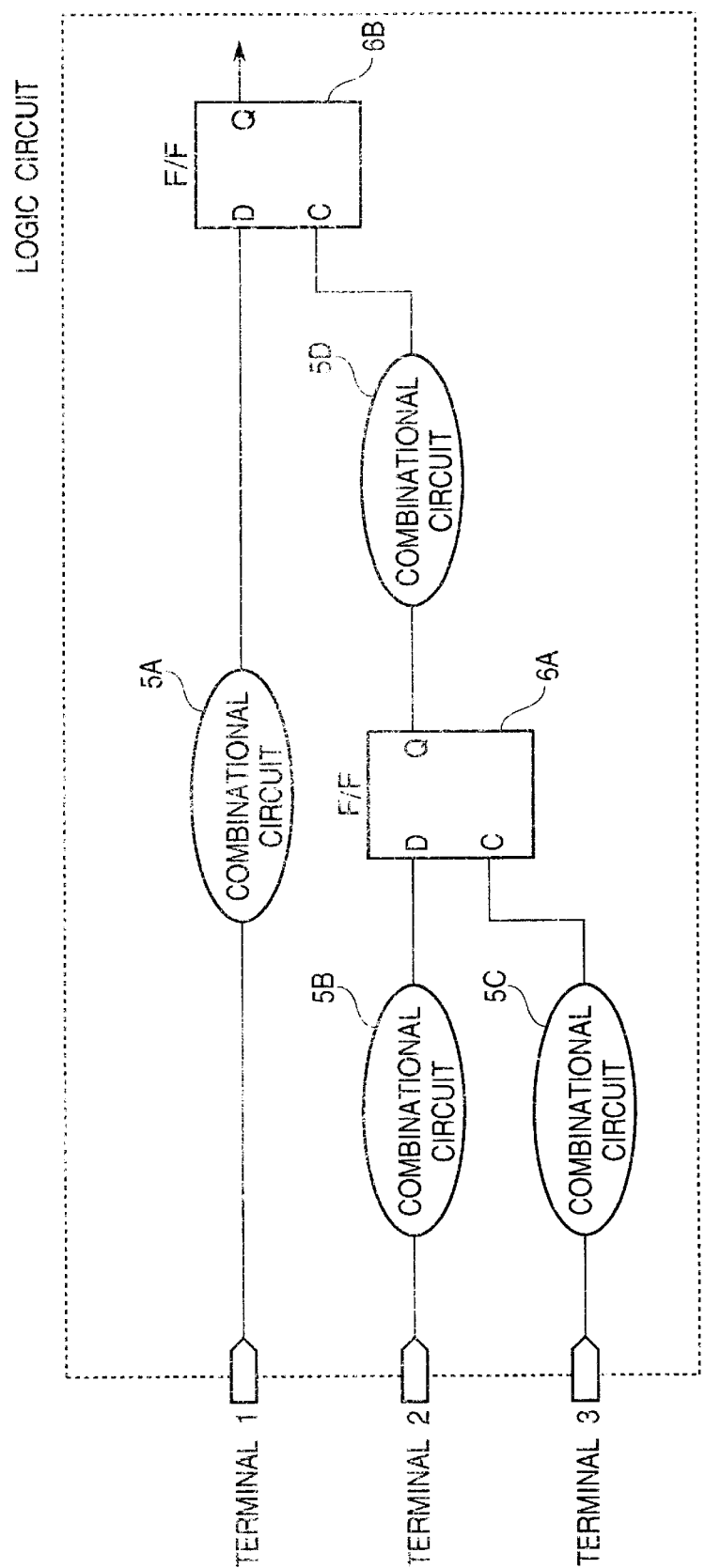
FIG. 1 is a logic diagram illustrating a part of a logic circuit in a semiconductor integrated circuit.
Figure 2:
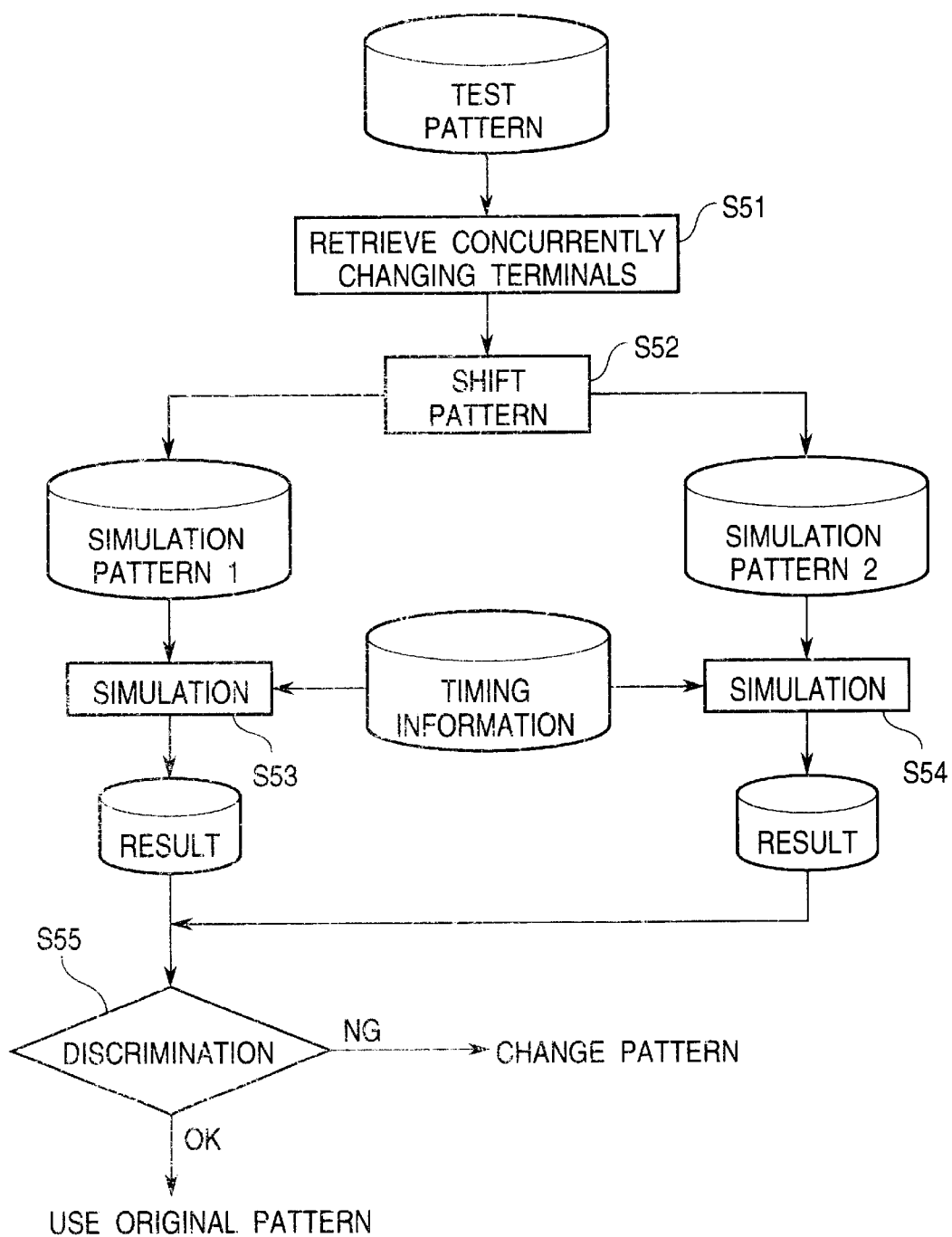
FIG. 2 is a flow chart illustrating the steps of the prior art method for discriminating the test pattern in order to avoid the trouble in measurement caused due to the tester skew.
Figure 5:
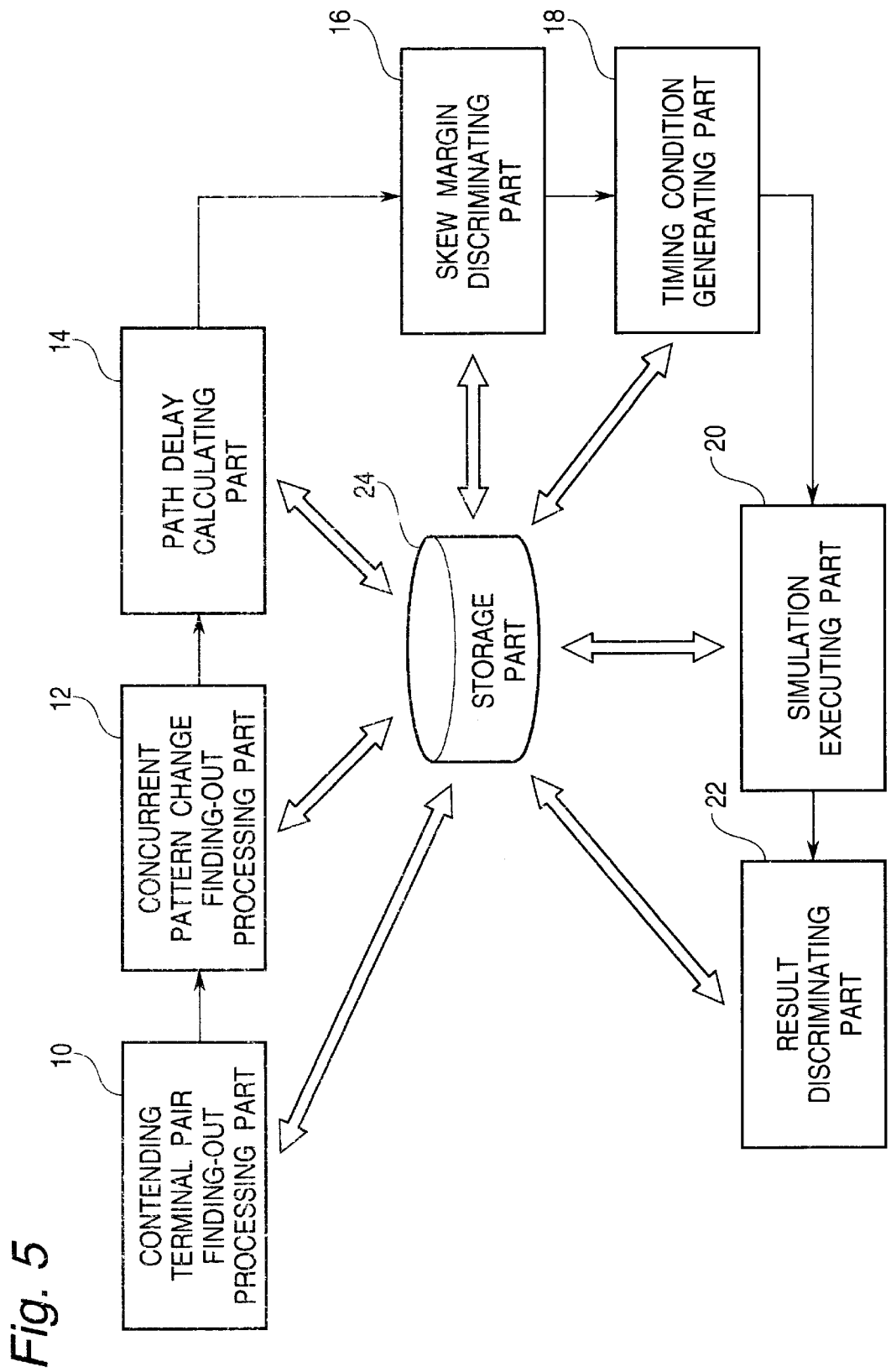
FIG. 5 is a block diagram showing one embodiment of the system in accordance with the present invention for generating a test pattern of an LSI tester.

Referring to FIG. 5, there is shown a block diagram showing one embodiment of the system in accordance with the present invention for generating a test pattern of an LSI tester.

The shown test pattern generating system includes a contending terminal pair finding-out processing part 10, a concurrent pattern change finding-out processing part 12, a path delay calculating part 14, a skew margin discriminating part 16, a timing condition generating part 18, a simulation executing part 20, a result discriminating part 22 and a storage part 24, functionally coupled as shown. However, this system is realized by a computer.

Figure 6:
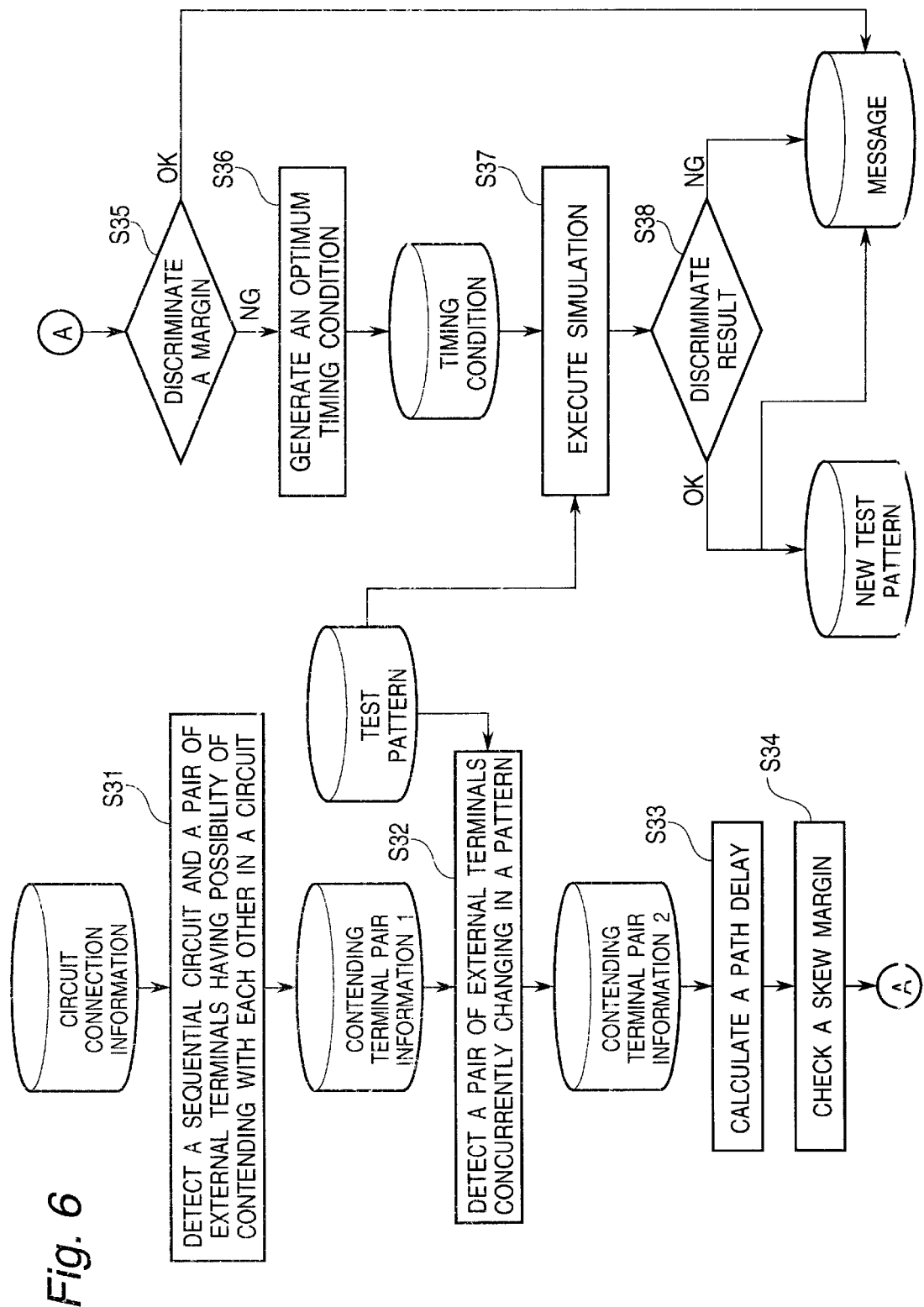
FIG. 6 is a flow chart for illustrating an operation of the system shown in FIG. 5, and illustrating the steps of one embodiment of the method in accordance with the present invention for generating a test pattern of an LSI tester.

Now, an operation of this test pattern generating system will be described with reference to the flow chart of FIG. 6, to illustrate the steps of one embodiment of the method in accordance with the present invention for generating a test pattern of an LSI tester.

The contending terminal pair finding-out processing part 10 reads circuit connection information (net list) from the storage part 24, and retrieves the circuit connection information to find out all first level combinations each composed of a sequential unitary circuit (such as a flipflop) having a first input and a second input (for example, a clock input and a data input) having possibility of causing the contending in a circuit construction, and a pair of potentially contending external terminals connected to the first input and the second input of the sequential unitary circuit (step S31) ("contending terminal pair information 1").

Succeedingly, the concurrent pattern change finding-out processing part 12 reads a test pattern used in simulation, from the storage part 12, and finds out, from the first level combinations found out in the step S31, second level combinations each composed of a pair of actually contending external terminals connected to the same sequential unitary circuit and concurrently changing their signal level in the test pattern, and a corresponding sequential unitary circuit (step S32) ("contending terminal pair information 2").

Figure 7:
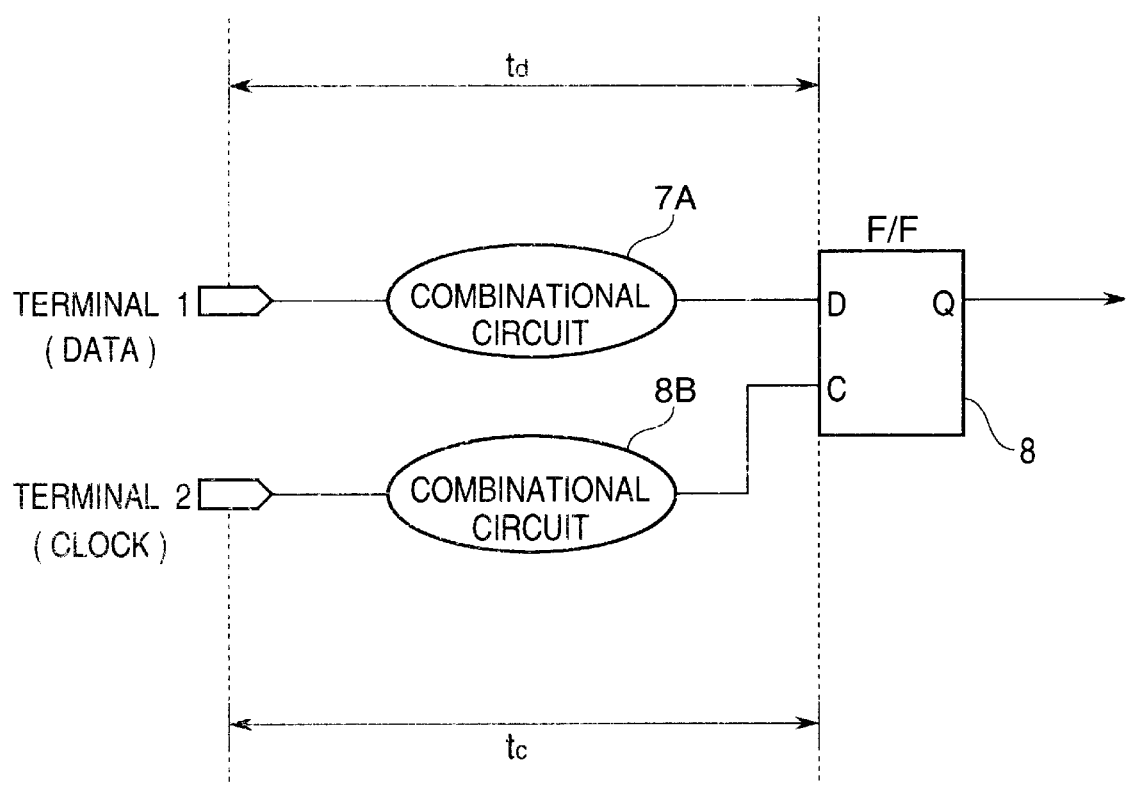
FIG. 7 illustrates a contending external terminal pair and a corresponding flipflop.

Referring to FIG. 7, an example of the contending terminal pair found out in the step S32 and the corresponding flipflop is shown. A data signal is supplied to an external terminal 1, and a clock signal is supplied to another external terminal 2. The data signal and the clock signal change concurrently in the test pattern. The data signal is supplied through a combinational circuit 7A to a data input D of a flipflop 8, and the clock signal is supplied through a combinational circuit 7B to a clock input C of the flipflop 8.

Then, the path delay calculating part 14 calculates on the basis of the circuit connection information, a path delay from the external terminal 1 to the flipflop 8, and a path delay from the external terminal 2 to the flipflop 8 (step S33). Here, it is assumed that the path delay from the external terminal 1 to the flipflop 8 is $t_d$, and the path delay from the external terminal 2 to the flipflop 8 is $t_c$.

Thereafter, the skew margin discriminating part 16 checks a tester skew margin (step S34).

Figure 8:
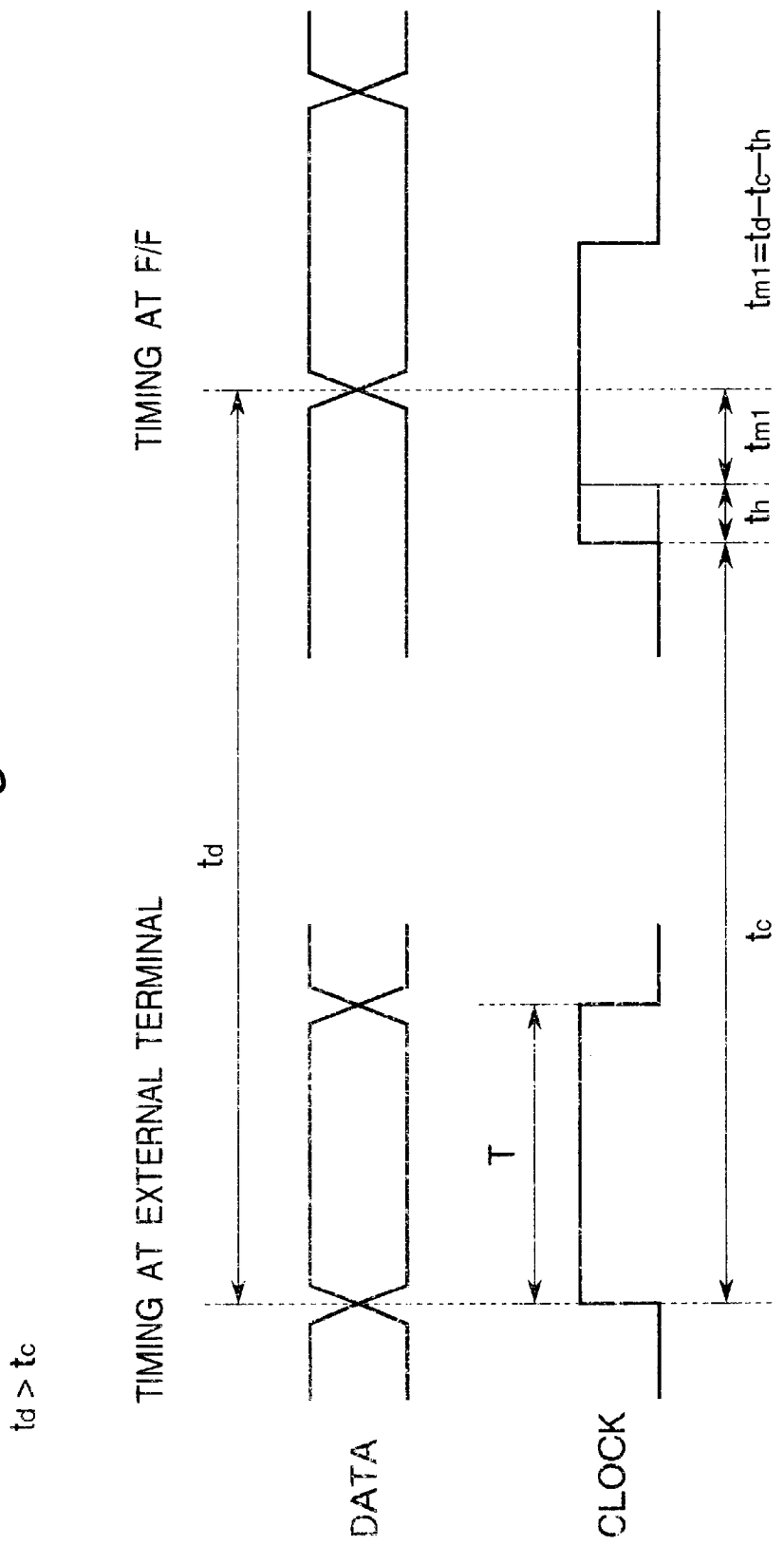
FIG. 8 is a timing chart illustrating the timing of the data signal and the clock signal at external terminals and at the flipflop in the case of td>tc.
Figure 9:
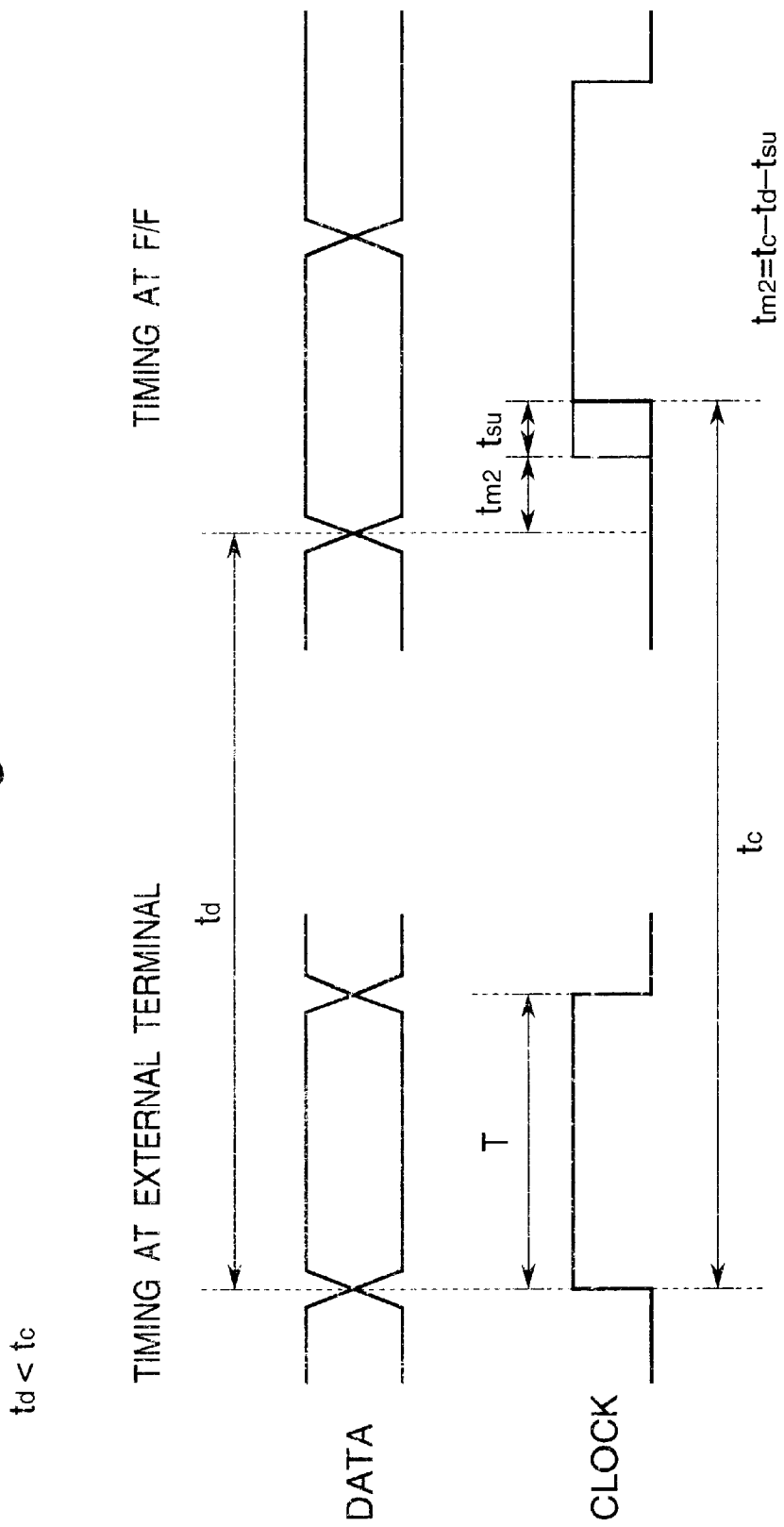
FIG. 9 is a timing chart illustrating the timing of the data signal and the clock signal at external terminals and at the flipflop in the case of td<tc.

Here, referring to FIGS. 8 and 9, FIG. 8 shows a timing chart illustrating the timing of the data signal and the clock signal at external terminals 1 and 2 and at the flipflop 8 in the case of $t_d > t_c$, and FIG. 9 shows a timing chart illustrating the timing of the data signal and the clock signal at external terminals 1 and 2 and at the flipflop 8 in the case of $t_d < t_c$.

In the example shown in FIG. 8, T shows a pattern period. Assuming that th means a hold time of the flipflop, and $t_{m1}$ indicates a hold side tester skew margin, $t_{m1} = t_d - t_c - t_h$.

Considering a tester skew value $t_{sk}$, the skew margin discriminating part 16 discriminates whether or not a hold error occurs in the flipflop in the following situation (step S 35).

(1) When the input timing of the clock signal to the external terminal 2 is later than the input timing of the data signal to the external terminal 1 because of the tester skew $t_{sk}$ (1a) At $t_{m1} > t_{sk}$, the hold error does not occur since the hold time is ensured even if the clock signal is late. Therefore, the flipflop operates normally (OK).

(1b) At $t_{m1} \leq t_{sk}$, the hold error occurs since the hold time is no longer ensured. Therefore, the flipflop does not operate normally (NG).

(2) When the input timing of the clock signal to the external terminal 2 is earlier than the input timing of the data signal to the external terminal 1 because of the tester skew tsk, since the hold time is ensured, the hold error does not occur. Therefore, the flipflop operates normally (OK).

In the example shown in FIG. 9, assuming that tsu means a setup time of the flipflop, and $t_{m2}$ indicates a setup side tester skew margin, $t_{m2} = t_c - t_d - t_{su}$.

Considering a tester skew value $t_{sk}$, the skew margin discriminating part 16 discriminates whether or not a setup error occurs in the flipflop in the following situation (step S35).

(3) When the input timing of the clock signal to the external terminal 2 is earlier than the input timing of the data signal to the external terminal 1 because of the tester skew $t_{sk}$ (3a) At $t_{m2} > t_{sk}$, the setup error does not occur since the setup time is ensured even if the clock signal is early. Therefore, the flipflop operates normally (OK).

(3b) At $t_{m2} \leq t_{sk}$, the setup error occurs since the setup time is no longer ensured. Therefore, the flipflop does not operate normally (NG).

(4) When the input timing of the clock signal to the external terminal 2 is later than the input timing of the data signal to the external terminal 1 because of the tester skew tsk, since the setup time is ensured, the setup error does not occur. Therefore, the flipflop operates normally (OK).

On the basis of the result of the above mentioned verification, when there is possibility of occurrence of the hold error or the setup error, the timing condition generating part 18 generates a timing relation in which the input timing of the data signal and the input timing of the clock signal are relatively shifted from each other in a direction of preventing the occurrence of the hold error or the setup error. This timing relation is generated for each of all the contending terminal pairs. Then, the timing condition generating part 18 combines the timing relations generated for all the contending terminal pairs, and generates an optimum timing relation which also fulfills a restriction of the LSI tester (step S36).

For example, in the case (1b) when $t_d > t_c$, the input timing of the clock signal is advanced to meet the relation of $t_{m1} > t_{sk}$.

Alternately, in the case (3b) when $t_d < t_c$, the input timing of the clock signal is delayed to meet the relation of $t_{m2} > t_{sk}$.

In the above two cases, the input timing of the clock signal is shied. However, it would be a matter of course to persons skilled in the art that in place of the clock signal, the input timing of the data signal can be shifted. In addition, in the above mentioned cases, the clock signal and the data signal are contending with each other. However, it would be a matter of course to persons skilled in the art that, when the clock signal and a set signal (or a reset signal) are contending with each other, the timing relation can be adjusted in a similar method.

The simulation executing part 20 executes the simulation in the timing condition determined by the timing condition generating part 18 (step S37), and then, the result discriminating part 22 verifies the validity of the timing condition (step S38). When there is no problem, namely, when no expected value error occurs, a tester pattern including the timing condition is outputted, so as to be reflected to a tester program.

As mentioned above, according to the present invention, a sequential unitary circuit having possibility of causing the contending in a circuit construction, and a pair of external terminals connected to a clock input and a data input of the sequential unitary circuit (potentially contending terminal pair) are extracted from the circuit connection information. From first level combinations each composed of the sequential unitary circuit and the corresponding potentially contending terminal pair, second level combinations each composed of the actually contending terminal pair connected to the same sequential unitary circuit and concurrently changing the test pattern, and the sequential unitary circuit, are extracted. In each of the second level combinations, the path delay value from each of external terminals of the actually contending terminal pair to the corresponding sequential unitary circuit is calculated. On the basis of the path delay values thus calculated and the tester skew value, there is generated an optimum timing condition preventing the contending in each sequential unitary circuit. The test pattern for the LSI tester is generated on the basis of the optimum timing condition thus generated. Therefore, even if the input timing of the signals supplied to the external terminals of the semiconductor integrated circuit become deviated from each other because of the tester skew, the result of the test by the LSI tester is always consistent with the result of the logical simulation if the semiconductor integrated circuit is non-defective.

The invention has thus been shown and described with reference to the specific embodiments. However, it should be noted that the present invention is in no way limited to the details of the illustrated structures but changes and modifications may be made within the scope of the appended claims.

What is claimed is:

1. A method for generating a test pattern used for testing, by an LSI tester, a semiconductor integrated circuit having a plurality of external terminals and a plurality of sequential unitary circuits, comprising the steps of:

extracting, from circuit connection information of said semiconductor integrated circuit, at least one first level combination composed of a sequential unitary circuit having a first input and a second input having possibility of causing the contending in a circuit construction, and a pair of potentially contending external terminals connected to said first input and said second input of said sequential unitary circuit;

extracting, from said at least one first level combination thus extracted, at least one second level combination composed of a pair of actually contending external terminals connected to the same sequential unitary circuit and concurrently changing their signal level in a test pattern, and a corresponding sequential unitary circuit;

in each of said at least one second level combination thus extracted, on the basis of a path delay value from each of said actually contending external terminals to said corresponding sequential unitary circuit, and on the basis of the value of a tester skew, determining an optimum timing condition preventing the contending in said sequential unitary circuit; and generating said test pattern for said LSI tester on the basis of said optimum timing condition thus determined.

2. A method claimed in claim 1 wherein said optimum timing condition is determined to satisfy a required setup time and a required hold time of said sequential unitary circuit even if respective input timing of signals to said pair of actually contending external terminals connected to said first input and said second input of said sequential unitary circuit, respectively, are deviated from each other by said tester skew.

3. A method claimed in claim 2 wherein said first input and said second input of said sequential unitary circuit are a clock input and a data input, respectively.

4. A method claimed in claim 1, further including, after said at least one second level combination is extracted, the steps of:

in each of said at least one second level combination thus extracted, calculating said path delay value from each of said actually contending external terminals to said corresponding sequential unitary circuit, and obtaining a tester skew margin from said path delay values and a setup time and a hold time of said sequential unitary circuit;

comparing said tester skew margin with the value of said tester skew, to discriminate whether or not at least one of a setup error and a hold error occurs in said sequential unitary circuit when respective input timing of signals to said pair of actually contending external terminals connected to said first input and said second input of said sequential unitary circuit, respectively, are deviated from each other by the value of said tester skew;

when said at least one of a setup error and a hold error occurs, determining an optimum timing condition preventing the contending in said sequential unitary circuit; and executing a simulation by using the test pattern having the input timing shifted on the basis of said optimum timing condition thus determined, and if the result of the simulation is good, determining said test pattern having the input timing shifted, as said test pattern for said LSI tester.

5. A method claimed in claim 4 wherein said first input and said second input of said sequential unitary circuit are a clock input and a data input, respectively.

6. A system for generating a test pattern used for testing, by an LSI tester, a semiconductor integrated circuit having a plurality of external terminals and a plurality of sequential unitary circuits, comprising:

a means for extracting, from circuit connection information of said semiconductor integrated circuit, at least one first level combination composed of a sequential unitary circuit having a first input and a second input having possibility of causing the contending in a circuit construction, and a pair of potentially contending external terminals connected to said first input and said second input of said sequential unitary circuit;

a means for extracting, from said at least one first level combination thus extracted, at least one second level combination composed of a pair of actually contending external terminals connected to the same sequential unitary circuit and concurrently changing their signal level in a test pattern, and a corresponding sequential unitary circuit;

a means for determining an optimum timing condition preventing the contending in said sequential unitary circuit, in each of said at least one second level combination thus extracted, on the basis of a path delay value from each of said actually contending external terminals to said corresponding sequential unitary circuit, and on the basis of the value of a tester skew; and a means for generating said test pattern for said LSI tester on the basis of said optimum timing condition thus determined.

7. A system claimed in claim 6 wherein said means for determining said optimum timing condition, determines said optimum timing condition to satisfy a required setup time and a required hold time of said sequential unitary circuit even if respective input timing of signals to said pair of actually contending external terminals connected to said first input and said second input of said sequential unitary circuit, respectively, are deviated from each other by said tester skew.

8. A system claimed in claim 7 wherein said first input and said second input of said sequential unitary circuit are a clock input and a data input, respectively.

9. A system claimed in claim 6, further including:

a means for calculating, in each of said at least one second level combination thus extracted, said path delay value from each of said actually contending external terminals to said corresponding sequential unitary circuit, and for obtaining a tester skew margin from said path delay values and a setup time and a hold time of said sequential unitary circuit;

a means for comparing said tester skew margin with the value of said tester skew, to discriminate whether or not at least one of a setup error and a hold error occurs in said sequential unitary circuit when respective input timing of signals to said pair of actually contending external terminals connected to said first input and said second input of said sequential unitary circuit, respectively, are deviated from each other by the value of said tester skew;

a means for determining an optimum timing condition preventing the contending in said sequential unitary circuit when said at least one of a setup error and a hold error occurs; and a means for executing a simulation by using the test pattern having the input timing shifted on the basis of said optimum timing condition thus determined, and if the result of the simulation is good, determining said test pattern having the input timing shifted, as said test pattern for said LSI tester.

10. A system claimed in claim 9 wherein said first input and said second input of said sequential unitary circuit are a clock input and a data input, respectively.

11. A recording medium recording a program for generating a test pattern used for testing, by an LSI tester, a semiconductor integrated circuit having a plurality of external terminals and a plurality of sequential unitary circuits, said program comprising the steps of:

extracting, from circuit connection information of said semiconductor integrated circuit, at least one first level combination composed of a sequential unitary circuit having a first input and a second input having possibility of causing the contending in a circuit construction, and a pair of potentially contending external terminals connected to said first input and said second input of said sequential unitary circuit;

extracting, from said at least one first level combination thus extracted, at least one second level combination composed of a pair of actually contending external terminals connected to the same sequential unitary circuit and concurrently changing their signal level in a test pattern, and a corresponding sequential unitary circuit;

in each of said at least one second level combination thus extracted, calculating said path delay value from each of said actually contending external terminals to said corresponding sequential unitary circuit, and obtaining a tester skew margin from said path delay values and a setup time and a hold time of said sequential unitary circuit;

comparing said tester skew margin with the value of a tester skew, to discriminate whether or not at least one of a setup error and a hold error occurs in said sequential unitary circuit when respective input timing of signals to said pair of actually contending external terminals connected to said first input and said second input of said sequential unitary circuit, respectively, are deviated from each other by the value of said tester skew;

when said at least one of a setup error and a hold error occurs, determining an optimum timing condition preventing the contending in said sequential unitary circuit; and executing a simulation by using the test pattern having the input timing shifted on the basis of said optimum timing condition thus determined, and if the result of the simulation is good, determining said test pattern having the input timing shifted, as said test pattern for said LSI tester.

12. A recording medium claimed in claim 11 wherein said first input and said second input of said sequential unitary circuit are a clock input and a data input, respectively.

* * * * *